US008222570B2

(12) United States Patent
Timans

(10) Patent No.: US 8,222,570 B2
(45) Date of Patent: Jul. 17, 2012

(54) SYSTEM AND PROCESS FOR HEATING SEMICONDUCTOR WAFERS BY OPTIMIZING ABSORPTION OF ELECTROMAGNETIC ENERGY

(75) Inventor: Paul Janis Timans, Mountain View, CA (US)

(73) Assignee: Mattson Technology, Inc., Fremont, CA (US)

( * ) Notice: Subject to any disclaimer, the term of this patent is extended or adjusted under 35 U.S.C. 154(b) by 279 days.

(21) Appl. No.: 12/270,377

(22) Filed: Nov. 13, 2008

(65) Prior Publication Data
US 2009/0098742 A1    Apr. 16, 2009

Related U.S. Application Data

(60) Division of application No. 11/370,095, filed on Mar. 7, 2006, now Pat. No. 7,453,051, which is a continuation of application No. 10/040,272, filed on Nov. 7, 2001, now Pat. No. 7,015,422, which is a continuation-in-part of application No. 09/747,522, filed on Dec. 21, 2000, now Pat. No. 6,970,644.

(51) Int. Cl.
*F27B 5/14* (2006.01)
*C23C 16/00* (2006.01)

(52) U.S. Cl. ............... 219/390; 219/444.1; 219/448.12; 219/409; 219/405; 219/411; 392/416; 392/418; 118/724; 118/725; 118/50.1

(58) Field of Classification Search ............... 219/390, 219/405, 411, 444.1, 448.12, 409; 392/416, 392/418; 118/724, 50.1
See application file for complete search history.

(56) References Cited

U.S. PATENT DOCUMENTS

| 2,318,533 | A | 5/1943 | Selvig |
| 3,879,257 | A | 4/1975 | Gentile et al. |
| 3,903,342 | A | 9/1975 | Roberts, Jr. |
| 4,166,001 | A | 8/1979 | Dunning et al. |
| 4,225,382 | A | 9/1980 | Kearney et al. |
| 4,234,356 | A | 11/1980 | Auston et al. |
| 4,316,074 | A | 2/1982 | Daly |
| 4,318,752 | A | 3/1982 | Tien |
| 4,344,818 | A | 8/1982 | Nuttall et al. |
| 4,375,993 | A | 3/1983 | Mori et al. |
| 4,414,038 | A | 11/1983 | Dausinger et al. |

(Continued)

FOREIGN PATENT DOCUMENTS
DE        29 53 138 A1    12/1980
(Continued)

OTHER PUBLICATIONS

PCT Search Report for International Application No. PCT/US02/35353 dated Mar. 26, 2003.

(Continued)

*Primary Examiner* — Shawntina Fuqua
(74) *Attorney, Agent, or Firm* — Dority & Manning, P.A.

(57) ABSTRACT

An apparatus for heat treating semiconductor wafers is disclosed. The apparatus includes a heating device which contains an assembly linear lamps for emitting light energy onto a wafer. The linear lamps can be placed in various configurations. In accordance with the present invention, tuning devices which are used to adjust the overall irradiance distribution of the light energy sources are included in the heating device. The tuning devices can be, for instance, are lamps or lasers.

37 Claims, 8 Drawing Sheets

U.S. PATENT DOCUMENTS

| | | | |
|---|---|---|---|
| 4,468,279 A | 8/1984 | Itzkan | |
| 4,487,635 A | 12/1984 | Kugimiya et al. | |
| 4,547,651 A | 10/1985 | Maruyama | |
| 4,550,684 A | 11/1985 | Mahawili | |
| 4,571,486 A | 2/1986 | Arai et al. | |
| 4,615,765 A | 10/1986 | Levinson et al. | |
| 4,672,740 A | 6/1987 | Shirai et al. | |
| 4,719,122 A | 1/1988 | Yamazaki | |
| 4,761,538 A | 8/1988 | Chiba et al. | |
| 4,780,590 A * | 10/1988 | Griner et al. | 219/121.65 |
| 4,959,245 A * | 9/1990 | Dobson et al. | 117/92 |
| 4,975,561 A | 12/1990 | Robinson et al. | |
| 5,155,336 A | 10/1992 | Gronet et al. | |
| 5,179,677 A | 1/1993 | Anderson et al. | |
| 5,222,112 A | 6/1993 | Terasawa et al. | |
| 5,253,324 A | 10/1993 | Wortman et al. | |
| 5,255,286 A | 10/1993 | Moslehi et al. | |
| 5,268,989 A | 12/1993 | Moslehi et al. | |
| 5,304,357 A | 4/1994 | Sato et al. | |
| 5,317,492 A | 5/1994 | Gronet et al. | |
| 5,317,656 A | 5/1994 | Moslehi et al. | |
| 5,326,171 A | 7/1994 | Thompson et al. | |
| 5,336,641 A | 8/1994 | Fair et al. | |
| 5,345,534 A | 9/1994 | Najm et al. | |
| 5,367,606 A | 11/1994 | Moslehi et al. | |
| 5,399,523 A | 3/1995 | Kakoschke | |
| 5,418,885 A | 5/1995 | Hauser et al. | |
| 5,436,172 A | 7/1995 | Moslehi | |
| 5,444,815 A | 8/1995 | Lee et al. | |
| 5,446,825 A | 8/1995 | Moslehi et al. | |
| 5,487,127 A | 1/1996 | Gronet et al. | |
| 5,493,987 A | 2/1996 | McDiarmid et al. | |
| 5,523,262 A | 6/1996 | Fair et al. | |
| 5,536,918 A | 7/1996 | Ohkase et al. | |
| 5,587,019 A | 12/1996 | Fujie | |
| 5,612,251 A | 3/1997 | Lee | |
| 5,635,409 A | 6/1997 | Moslehi | |
| 5,656,132 A | 8/1997 | Farrington, Jr. et al. | |
| 5,668,376 A | 9/1997 | Weckström et al. | |
| 5,683,173 A | 11/1997 | Gronet et al. | |
| 5,689,614 A | 11/1997 | Gronet et al. | |
| 5,695,607 A | 12/1997 | Oriaran et al. | |
| 5,743,643 A | 4/1998 | Gronet et al. | |
| 5,762,713 A | 6/1998 | Paranjpe | |
| 5,767,486 A | 6/1998 | Gronet et al. | |
| 5,790,751 A | 8/1998 | Gronet et al. | |
| 5,814,365 A | 9/1998 | Mahawili | |
| 5,820,942 A | 10/1998 | Singh et al. | |
| 5,840,125 A | 11/1998 | Gronet et al. | |
| 5,851,629 A | 12/1998 | Oriaran et al. | |
| 5,861,609 A | 1/1999 | Kaltenbrunner et al. | |
| 5,874,711 A | 2/1999 | Champetier et al. | |
| 5,882,479 A | 3/1999 | Oriaran et al. | |
| 5,886,320 A | 3/1999 | Gallo et al. | |
| 5,908,307 A | 6/1999 | Talwar et al. | |
| 5,911,890 A | 6/1999 | Dulaney et al. | |
| 5,913,974 A | 6/1999 | Habuka | |
| 5,930,456 A | 7/1999 | Vosen | |
| 5,932,068 A | 8/1999 | Farrington, Jr. et al. | |
| 5,936,698 A | 8/1999 | Koyama | |
| 5,937,142 A | 8/1999 | Moslehi et al. | |
| 5,954,982 A | 9/1999 | Sogard | |
| 5,958,185 A | 9/1999 | Vinson et al. | |
| 5,960,158 A | 9/1999 | Gat et al. | |
| 5,970,214 A | 10/1999 | Gat | |
| 5,970,382 A | 10/1999 | Shah | |
| 5,980,637 A | 11/1999 | Singh et al. | |
| 5,997,175 A | 12/1999 | Champetier et al. | |
| 6,001,175 A | 12/1999 | Maruyama et al. | |
| 6,016,383 A | 1/2000 | Gronet et al. | |
| 6,017,418 A | 1/2000 | Oriaran et al. | |
| 6,019,850 A | 2/2000 | Frey | |
| 6,027,244 A | 2/2000 | Champetier et al. | |
| 6,033,523 A | 3/2000 | Dwiggins et al. | |
| 6,033,761 A | 3/2000 | Dwiggins et al. | |
| 6,034,357 A | 3/2000 | Guardado | |
| 6,034,378 A * | 3/2000 | Shiraishi | 250/559.29 |
| 6,051,104 A | 4/2000 | Oriaran et al. | |
| 6,056,434 A | 5/2000 | Champetier | |
| 6,068,731 A | 5/2000 | Dwiggins et al. | |
| 6,075,922 A | 6/2000 | Tay et al. | |
| 6,084,213 A | 7/2000 | Kohav et al. | |
| 6,103,063 A | 8/2000 | Oriaran et al. | |
| 6,113,740 A | 9/2000 | Oriaran et al. | |
| 6,122,439 A | 9/2000 | Gronet et al. | |
| 6,143,131 A | 11/2000 | Dwiggins et al. | |
| 6,153,053 A | 11/2000 | Harper et al. | |
| 6,160,242 A | 12/2000 | Guardado | |
| 6,174,651 B1 | 1/2001 | Thakur | |
| 6,200,023 B1 | 3/2001 | Tay et al. | |
| 6,204,484 B1 | 3/2001 | Tay et al. | |
| 6,210,484 B1 | 4/2001 | Hathaway | |
| 6,222,990 B1 | 4/2001 | Guardado et al. | |
| 6,258,614 B1 | 7/2001 | Kaneko | |
| 6,281,141 B1 | 8/2001 | Das et al. | |
| 6,293,696 B1 | 9/2001 | Guardado | |
| 6,310,328 B1 | 10/2001 | Gat | |
| 6,319,761 B1 | 11/2001 | Zhang et al. | |
| 6,329,105 B1 | 12/2001 | Fujita et al. | |
| 6,359,263 B2 | 3/2002 | Tay et al. | |
| 6,403,923 B1 | 6/2002 | Tay et al. | |
| 6,514,876 B1 | 2/2003 | Thakur et al. | |
| 6,531,681 B1 | 3/2003 | Markle et al. | |
| 6,559,424 B2 | 5/2003 | O'Carroll et al. | |
| 6,570,656 B1 | 5/2003 | Owens, Jr. et al. | |
| 6,610,967 B2 | 8/2003 | Gat | |
| 6,614,005 B1 | 9/2003 | Walk et al. | |
| 6,638,876 B2 | 10/2003 | Levy et al. | |
| 6,650,480 B2 | 11/2003 | Tanaka | |
| 6,657,154 B1 | 12/2003 | Tanabe et al. | |
| 6,693,257 B1 * | 2/2004 | Tanaka | 219/121.76 |
| 6,717,158 B1 | 4/2004 | Gat et al. | |
| 6,727,474 B2 | 4/2004 | Gat | |
| 6,747,245 B2 | 6/2004 | Talwar et al. | |
| 6,770,146 B2 | 8/2004 | Koren et al. | |
| 6,771,895 B2 | 8/2004 | Gat et al. | |
| 6,797,312 B2 | 9/2004 | Kong et al. | |
| 6,808,758 B1 | 10/2004 | Thakur | |
| 6,835,914 B2 | 12/2004 | Timans | |
| 6,875,691 B2 | 4/2005 | Li et al. | |
| 6,884,719 B2 | 4/2005 | Chang et al. | |
| 6,902,622 B2 | 6/2005 | Johnsgard et al. | |
| 6,970,644 B2 | 11/2005 | Koren et al. | |
| 7,015,422 B2 | 3/2006 | Timans | |
| 7,269,343 B2 | 9/2007 | Timans | |
| 7,453,051 B2 | 11/2008 | Timans | |
| 2002/0017618 A1 | 2/2002 | Gat et al. | |
| 2002/0027716 A1 | 3/2002 | Tanaka | |
| 2002/0104619 A1 | 8/2002 | Koren et al. | |
| 2002/0137311 A1 | 9/2002 | Timans | |
| 2003/0031793 A1 | 2/2003 | Chang et al. | |
| 2003/0124820 A1 | 7/2003 | Johnsgard et al. | |
| 2003/0196993 A1 | 10/2003 | Jennings | |
| 2003/0196995 A1 | 10/2003 | Jennings | |
| 2003/0196996 A1 | 10/2003 | Jennings et al. | |
| 2003/0209326 A1 | 11/2003 | Lee et al. | |
| 2003/0235983 A1 | 12/2003 | Li et al. | |
| 2003/0236642 A1 | 12/2003 | Timans | |
| 2004/0018008 A1 | 1/2004 | Koren et al. | |
| 2004/0025787 A1 | 2/2004 | Selbrede et al. | |
| 2004/0035847 A1 | 2/2004 | Gat | |
| 2004/0058557 A1 | 3/2004 | Eisele et al. | |
| 2004/0063290 A1 | 4/2004 | Jennings et al. | |
| 2004/0084427 A1 | 5/2004 | Talwar et al. | |
| 2004/0084437 A1 | 5/2004 | Timans | |
| 2005/0006916 A1 | 1/2005 | Mantz | |
| 2005/0098552 A1 | 5/2005 | Timans | |

FOREIGN PATENT DOCUMENTS

| | | |
|---|---|---|
| DE | 4306398 A1 | 9/1994 |
| EP | 0476307 A1 | 3/1992 |
| EP | 0505928 A2 | 9/1992 |
| EP | 0576791 A1 | 1/1994 |
| EP | 0618329 B1 | 10/1994 |
| EP | 0675225 B1 | 10/1995 |
| EP | 0811709 A2 | 12/1997 |
| EP | 0811709 A3 | 12/1997 |

| | | | |
|---|---|---|---|
| EP | 0821084 A1 | 1/1998 |
| EP | 0811709 A3 | 8/1998 |
| GB | 2130009 A | 5/1984 |
| JP | 58-112327 | 7/1983 |
| JP | 01-173707 A | 7/1989 |
| JP | 6-29212 | 2/1994 |
| WO | WO 9513424 A1 | 5/1995 |
| WO | WO 96/41370 A1 | 12/1996 |
| WO | WO9852214 | 11/1998 |
| WO | WO9958733 | 11/1999 |
| WO | WO 00/41223 A1 | 7/2000 |
| WO | WO0145501 A2 | 6/2001 |
| WO | WO0145501 A3 | 6/2001 |

OTHER PUBLICATIONS

Article—*Absorption of Infrared Radiation in Silicon*, I.W. Boyd, T.D. Binnie, J.I.B. Wilson, and M. J. Colles, J. Appl. Phys. 55 (8), Apr. 15, 1984, pp. 3061-3063.

Abstract of Japanese Patent No. JP5259082, Oct. 8, 1993.

Article—*Temperature measurement in rapid thermal processing*, Paul J Timans, Solid State Technology, Apr. 1997, 6 pages.

Article—*Reduced Thermal Processing for ULSI*, C. Hill, S. Jones, and D. Boys, Rapid Thermal Annealing—Theory and Practice, pp. 143-180.

Article—*Application of Rapid Thermal Processing in Manufacturing: The Effect of Emissivity and Coupling*, James S. Nakos, pp. 421-428.

Article—*The Effect of Multilayer Patterns on Temperature Uniformity during Rapid Thermal Processing*, Jeffrey P. Hebb and Klavs F. Jensen, J. Electrochem. Soc., vol. 143, No. 3, Mar. 1996, pp. 1142-1151.

Internet Publication from Intellectual Property Network—"Pseudo Brewster Angle of Incidence for Joining or Removing a Chip by Laser Beam." pp. 5194-5195 dated Apr. 1981.

Publication title "Some Features of Laser Heating of Oxidizable Metals in Air by Obliquely Incident Radiation" nby M. I. Arzuov, A. I. Barchukov, F. V. Bunkin, N. A. Kirichenko, V. I. Konov, and B. S. Luk'yanchuck. Sov. J. Quantum Electro. 9(10), Oct. 1979.

Abstract of German Patent No. DE4306398, Sep. 8, 1994.

Abstract of Patent No. EP0505928, Sep. 30, 1992.

Article—*Absorption of Infrared Radiation in Silicon*, I.W. Boyd, T.D. Birmie, J.I.B. Wilson, and M. J. Colles, J. Appl. Phys. 55 (8), Apr. 15, 1984, pp. 3061-3063.

Article—*Beam Processing in Silicon Device Technology*, C. Hill, Laser and Electron-Beam Solid Interactions and Materials Process, 1981, pp. 361-374.

Article—*Effect of Polarization on Laser-Induced Surface-Temperature Rise*, Lu et al., Applied Physics A (Solids and Surfaces), vol. 58, 1994, pp. 423-429.

Article—*Rapid direct writing of high-aspect ratio trenches in silicon: Process physic*, Treyz et al., Journal of Vacuum Science & Technology B: Microelectronics and Nanometer Structures, vol. 6, No. 1, Jan. 1988, pp. 37-44.

Applied—*Rapid direct writing of high-aspect-ratio trenches in silicon*, Teryz et al., Applied Physics Letters, vol. 50, No. 8, Feb. 23, 1987, pp. 475-477.

Article—*Temperature measurement in rapid thermal processing*, Paul J. Timans, Solid State Technology, Apr. 1997, 6 pages.

Article—*The Effect of Multilayer Patterns on Temperature Uniformity during Rapid Thermal Processing*, Jeffrey P. Hebb and Klavs F. Jensen, J. Electrochem. Soc., vol. 143, No. 3, Mar. 1996, pp. 1142-1151.

Publication title "Some features of Laser Heating of Oxidizable Metals in Air by Obliquely Incident Radiation" by M. I. Arzuov, A. I. Barchukov, F. V. Bunkin, N. A. Kirichenko, V. I. Konov, and B.S. Luk'yanchuck. Sov. J. Quantum Electro. 9(10), Oct. 1979.

Article—*Alignment of grain boundary in a Si film crystallized by a linearly polarized laser beam on a glass substrate*, Horita et al., Applied Physics Letters, vol. 78, No. 15, Apr. 9, 2001, pp. 2250-2252.

Article—*Influence of the beam irradiation condition with oblique incidence on crystallization of an Si film by a linearly polarized pulse laser*, Nakata et al., Mat. Res. Soc. Symp. Proc., vol. 715, 2002, pp. A22.1.1-A22.1.6.

Article entitled "Effect of Polarization on Laser-Induced Surface-Temperature Rise" by Lu, et al., *Applied Physics A*, 1994, 7 pages.

Article entitled "Rapid direct writing of high-aspect ratio trenched in silicon: Process physics" by Treyz, et al., 1987, 3 pages.

Article entitled "Rapid direct writing of high-aspect ratio trenches in silicon" by Treyz, et al., 1987, 8 pages.

* cited by examiner

SYSTEM AND PROCESS FOR HEATING SEMICONDUCTOR WAFERS BY OPTIMIZING ABSORPTION OF ELECTROMAGNETIC ENERGY

RELATED APPLICATIONS

The present application is a divisional application of U.S. application Ser. No. 11/370,095, filed on Mar. 7, 2006, which is a continuation application of a continuation in part application with U.S. Ser. No. 10/040,272 filed on Nov. 7, 2001 and which claims priority to U.S. patent application Ser. No. 09/747,522 filed on Dec. 21, 2000.

BACKGROUND OF THE INVENTION

A thermal processing chamber as used herein refers to a device that heats objects, such as semiconductor wafers. Such devices typically include a substrate holder for holding a semiconductor wafer and an energy source, such as a plurality of lamps, that emits thermal energy for heating the wafer. During heat treatment, the semiconductor wafers are heated under controlled conditions according to a preset temperature regime. For monitoring the temperature of the semiconductor wafer during heat treatment, thermal processing chambers also typically include temperature sensing devices, such as pyrometers, that sense the radiation being emitted by the semiconductor wafer at a selected band of wavelengths. By sensing the thermal radiation being emitted by the wafer, the temperature of the wafer can be calculated with reasonable accuracy.

In alternative embodiments, instead of or in addition to using radiation sensing devices, thermal processing chambers can also contain thermocouples for monitoring the temperature of the wafers. Thermocouples measure the temperature of objects by direct contact.

Many semiconductor heating processes require a wafer to be heated to high temperatures so that various chemical and physical reactions can take place as the wafer is fabricated into a device. During rapid thermal processing, which is one type of processing, semiconductor wafers are typically heated by an array of lights to temperatures, for instance, from about 400° C. to about 1,200° C., for times which are typically less than a few minutes. During these processes, one main goal is to heat the wafers as uniformly as possible.

Problems have been experienced in the past, however, in being able to maintain a constant temperature throughout the wafer and in being able to control the rate at which the wafer is heated. If the wafer is heated nonuniformly, various unwanted stresses can develop in the wafer. Not being able to heat the wafers uniformly also limits the ability to uniformly deposit films on the wafers, to uniformly anneal films on the wafers, besides limiting the ability to perform various other chemical and physical processes on the wafers.

Some of the problems that have been experienced in the past relate to the fact that semiconductor wafers are frequently coated with films of materials that affect the reflectivity and absorptivity of the surface. For instance, there can be variations between different wafers, and there can also be variations within a single wafer as a result of patterns produced on the wafer during the semiconductor device fabrication sequence. When wafers are irradiated by electromagnetic radiation, these variations in optical properties result in variations in the ability of the wafer to absorb power and consequent variations in the temperature reached. This can degrade the repeatability of thermal processing and can also degrade the uniformity across any given wafer. For example, a wafer with different regions coated with different materials will have different power absorption characteristics in these regions.

As such, a need currently exists for an improved thermal processing chamber and process that is capable of more efficiently heating semiconductor wafers and that is capable of uniformly heating semiconductor wafers.

SUMMARY OF THE INVENTION

The present invention is generally directed to various processes for heating semiconductor wafers. In particular, the present invention is directed to configuring light sources emitting light energy onto the wafer in order to optimize absorption of the energy by the wafer. The present invention is carried out by varying the angle of incidence of the light energy contacting the wafer, using multiple wavelengths of light, and configuring the light energy such that it contacts the wafer in a particular polarized state.

For example, in one embodiment of the present invention, the process includes the steps of placing a semiconductor wafer in a processing chamber. Light energy is directed onto the wafer for heating the wafer. The light energy contacts the wafer at an angle of incidence of greater than 0°. Particularly, the angle of incidence is greater than 10°, and more particularly from about 40° to about 85°.

The process further includes the step of polarizing the light energy prior to the light energy contacting the semiconductor wafer. In particular, the light energy is polarized such that the light energy contacts the semiconductor wafer in a p-polarized state. Any suitable polarizing device can be used to polarize the light. For example in one embodiment, a beam splitting device can be used that creates a first p-polarized light energy beam and a second p-polarized light energy beam. The first and second p-polarized light energy beams are then directed onto the semiconductor wafer. In still a further alternative embodiment of the present invention, the light energy is polarized using a wire-grid polarizing device.

The light energy used in accordance with the present invention can be emitted from a laser or from an incoherent light source. When using an incoherent light source, such as an arc lamp or a tungsten halogen lamp, the light can be collimated prior to being polarized.

In an alternative embodiment of the present invention, the process includes the steps of placing a semiconductor wafer in a processing chamber and directing laser beams onto the semiconductor wafer from at least a first laser and a second laser. The first laser emits light at a first wavelength range and the second laser emits light at a second wavelength range. In order to heat the wafer more uniformly and efficiently, the first wavelength range is different from the second wavelength range.

Besides or in addition to using laser beams at different wavelength ranges, the beams can contact the wafer at different angles of incidence. In particular, each beam should contact the semiconductor wafer at an angle of incidence greater than 10°, in particular at an angle of incidence from about 40° to about 85°. When using laser beams to heat semiconductor wafers, the laser beams can be configured to strike the wafer in a particular state, such as a p-polarized state.

In one particular embodiment of the present invention, which is particularly well suited to carry out an ion implantation anneal process, the method of the present invention includes placing a semiconductor wafer in a thermal processing chamber. A pulsed laser beam is then directed onto the semiconductor wafer. The pulsed laser beam is configured to strike the wafer at an angle of incidence of at least 10° and in a particular state, such as a p-polarized state.

Light energy sources configured in accordance with the present invention can be used alone to heat wafers or can be used in conjunction with other energy sources. For instance, the light energy sources of the present invention can be used in conjunction with other light energy sources and/or in conjunction with a susceptor plate.

Other features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Repeat use of references characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

A thermal processing apparatus uses thermal energy, such as intense light, to heat a semiconductor wafer as part of the manufacturing process of integrated circuits. Exposure to light energy causes a rapid increase in the temperature of a semiconductor wafer and allows processing times to be relatively short. In rapid thermal processing systems, it is important to radiate the wafer with very high intensity light in a very uniform and controlled fashion. As stated above, the difficulty with current devices is that the requirements for the intensity of the radiated light and the ability to heat wafers uniformly are very difficult to achieve.

For instance, semiconductor wafers are frequently coated with materials that affect the reflectivity and the absorptivity of the surface. These coatings contained on the wafers can lead to inefficiencies in heating the wafers and can also lead to temperature variations within the wafer. For example, a wafer having regions coated with different materials will have different power absorption characteristics in these regions.

In general, the present invention is directed to an apparatus and method for heating semiconductor wafers uniformly and efficiently. Wafers processed according to the present invention are heated, at least partly, by light energy. The present invention is directed to optimizing the angle of incidence, the plane of polarization and the wavelengths of the heating radiation in order to increase the absorptivity of the wafer and to decrease the effects of variations in the optical properties of the surfaces of the wafer.

More particularly, the present invention is directed to placing lamps in a thermal processing chamber for heating objects, such as semiconductor wafers. The lamps are configured so that the light energy being emitted by the lamps contacts the wafer at an angle of incidence that optimizes absorption by the wafer. Alternatively, or in addition to optimizing the angle of incidence, the light energy being emitted by the lamp can also be configured such that the light energy contacts the wafer in a plane of polarization that also optimizes absorption. Finally, the present invention is also directed to contacting the wafer with multiple wavelengths of light so that at least certain of the wavelengths are being efficiently absorbed by the wafer.

Figure 3:
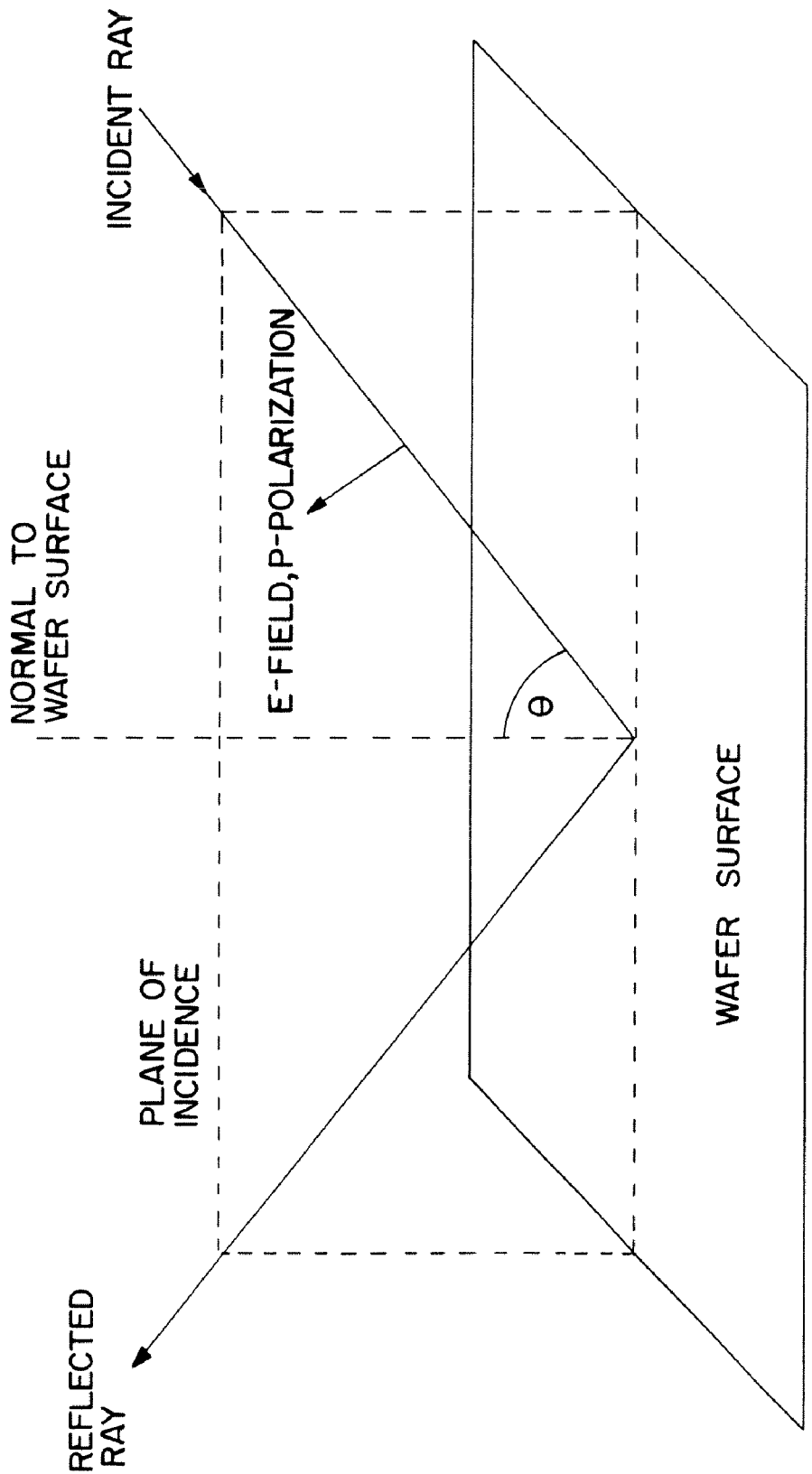
FIG. 3 is an informational diagram provided to illustrate several terms to be used in the present application.

Referring to FIG. 3, a diagram is shown that illustrates some definitions and terms used in the present application. As shown, the angle of incidence, 2, is the angle between the normal to the wafer surface and direction of propagation of the heating radiation. The plane of incidence is the plane that contains the normal to the wafer surface and the ray of energy incident on the wafer surface. The p-polarization plane is the polarization state where the electric field vector of the incident radiation lies in the plane of incidence. This state is also known as the transverse magnetic (TM) polarization. The polarization at right angles to the p-polarization state, where the electric field vector is perpendicular to the plane of incidence, is known as the s-polarization state or the transverse electric (TE) polarization state.

The lamps that can be used in accordance with the present invention can vary depending upon the particular application. For instance, in one embodiment, lasers can be used. Lasers emit light over a very narrow wavelength range. Besides lasers, various incoherent light sources can also be used in the system of the present invention. Incoherent light sources as opposed to lasers, emit light over a broad range of wavelengths. Incoherent light sources that can be used in the present invention include arc lamps, tungsten halogen lamps, and the like.

Lamps configured according to the present invention can be used alone to heat semiconductor wafers or, alternatively, can be used in conjunction with other thermal energy sources. For instance, the lamps can be used in conjunction with a susceptor or hot plate, which heats wafers through electrical resistance. In another embodiment, the lamps configured according to the present invention can be used in conjunction with other lamps that are not specially configured.

Figure 1:
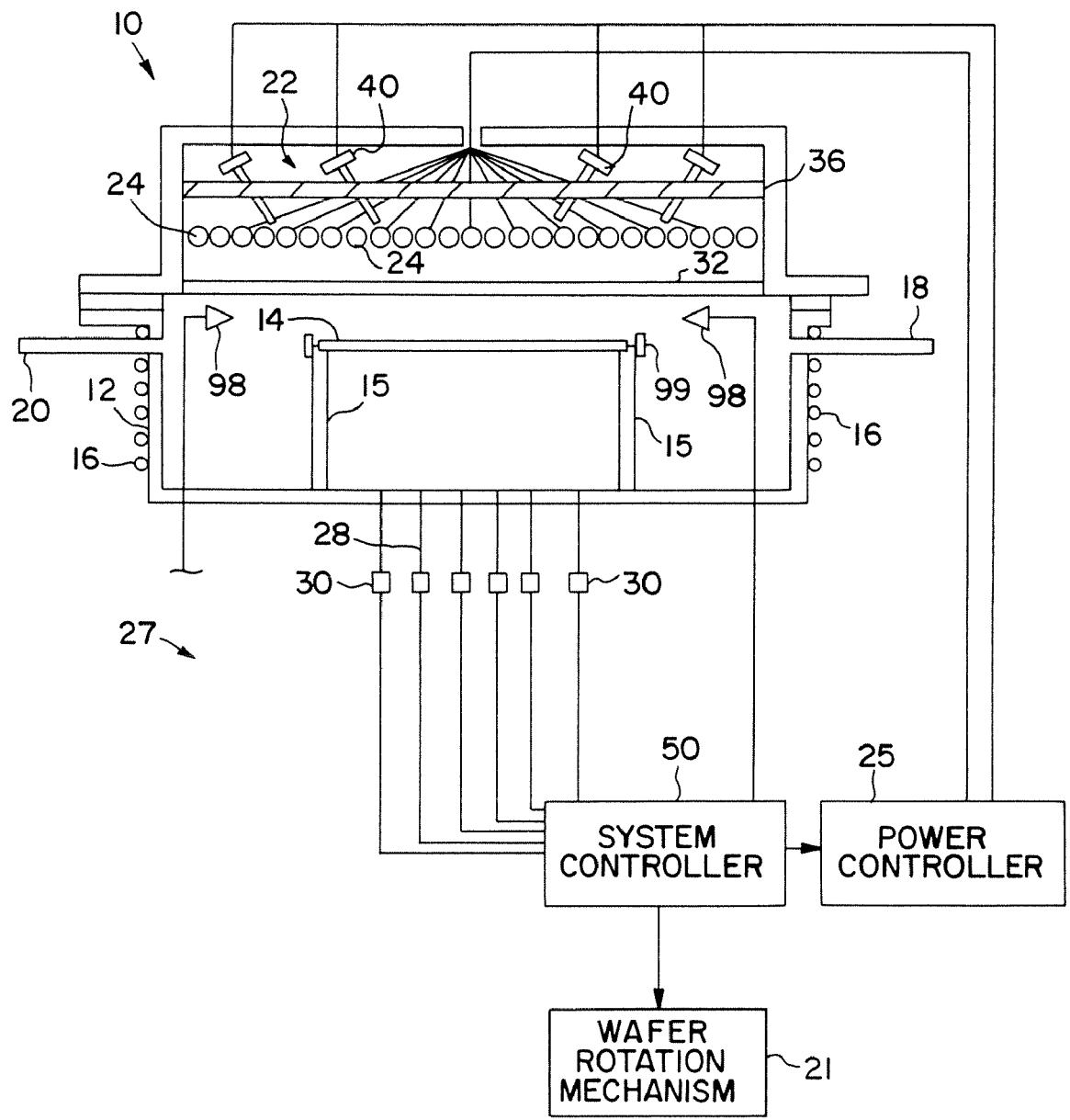
FIG. 1 is a cross-sectional view of one embodiment of a thermal processing chamber that may be used in accordance with the present invention.

Referring to FIG. 1, one embodiment of a system generally 10 made in accordance with the present invention is shown. In this embodiment, the system includes a plurality of lamps 40 configured in accordance with the present invention and a plurality of other lamps 24 that are placed over a semiconductor wafer 14 as is conventional in the art.

As shown, system 10 includes a processing chamber 12 adapted to receive substrates such as a wafer 14 for conducting various processes. Wafer 14 can be made from a semiconductive material, such as silicon. As shown, wafer 14 is positioned on a substrate holder 15 made from a thermal insulating material such as quartz. Chamber 12 is designed to heat wafer 14 at very rapid rates and under carefully controlled conditions. Chamber 12 can be made from various materials, including metals and ceramics. For instance, chamber 12 can be made from stainless steel or can be a cold wall chamber made from, for instance, quartz.

When chamber 12 is made from a heat conductive material, preferably the chamber includes a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a constant temperature.

Chamber 12 can also include a gas inlet 18 and a gas outlet 20 for introducing a gas into the chamber and/or for maintaining the chamber within a preset pressure range. For instance, a gas can be introduced into chamber 12 through gas inlet 18 for reaction with wafer 14. Once processed, the gas can then be evacuated from the chamber using gas outlet 20.

Alternatively, an inert gas can be fed to chamber 12 through gas inlet 18 for preventing any unwanted or undesirable side reactions from occurring within the chamber. In a further embodiment, gas inlet 18 and gas outlet 20 can be used to pressurize chamber 12. A vacuum can also be created in chamber 12 when desired, using gas outlet 20 or an additional larger outlet positioned beneath the level of the wafer.

During processing, substrate holder 15, in one embodiment, can be adapted to rotate wafer 14 using a wafer rotation mechanism 21. Rotating the wafer promotes greater temperature uniformity over the surface of the wafer and promotes enhanced contact between wafer 14 and any gases introduced into the chamber. It should be understood, however, that besides wafers, chamber 12 is also adapted to process optical parts, films, fibers, ribbons, and other substrates having any particular shape.

A heat source or heating device generally 22 is included in communication with chamber 12 for heating wafer 14 during processing. Heating device 22 includes a plurality of linear lamps 24, such as tungsten-halogen lamps. As used herein, a "linear lamp" refers to a lamp that is designed to emit most of its energy through the longest dimension of the lamp. For instance, in most embodiments, linear lamps emit the majority of their energy through the side of the lamp. As shown in FIG. 1, lamps 24 are horizontally aligned above wafer 14. It should be understood, however, that lamps 24 may be placed at any particular location such as only below the wafer or above and below the wafer. Further, additional lamps could be included within system 10 if desired.

Besides linear lamps, the system of the present invention can also use vertically oriented lamps. These lamps are positioned such that the end of the lamp faces the wafers.

As shown in the figure, lamps 24 are equipped with a gradual power controller 25 that can be used to increase or decrease the light energy being emitted by any of the lamps.

In order to assist in directing the light energy being emitted by lamps 24 onto wafer 14, the lamps can be associated with a reflector or a set of reflectors. For instance, as shown in FIG. 1, the heating device 22 includes a reflector plate 36 positioned above the linear lamps 24. Reflector plate 36 can be made from any material suitable for reflecting light energy and can have any suitable shape that will assist in directing the light energy toward the wafer 14.

In addition to lamps 24, as shown in FIG. 1, the system includes light sources or lamps 40 in accordance with the present invention. As shown, lamps 40 are positioned with respect to the wafer 14 at an angle in order to optimize absorption of light energy by the wafer. As will be described in more detail below, besides adjusting the angle of incidence, radiation emitted by lamps 40 can also be configured to strike the wafer in or near the p-polarization plane.

Figure 2:
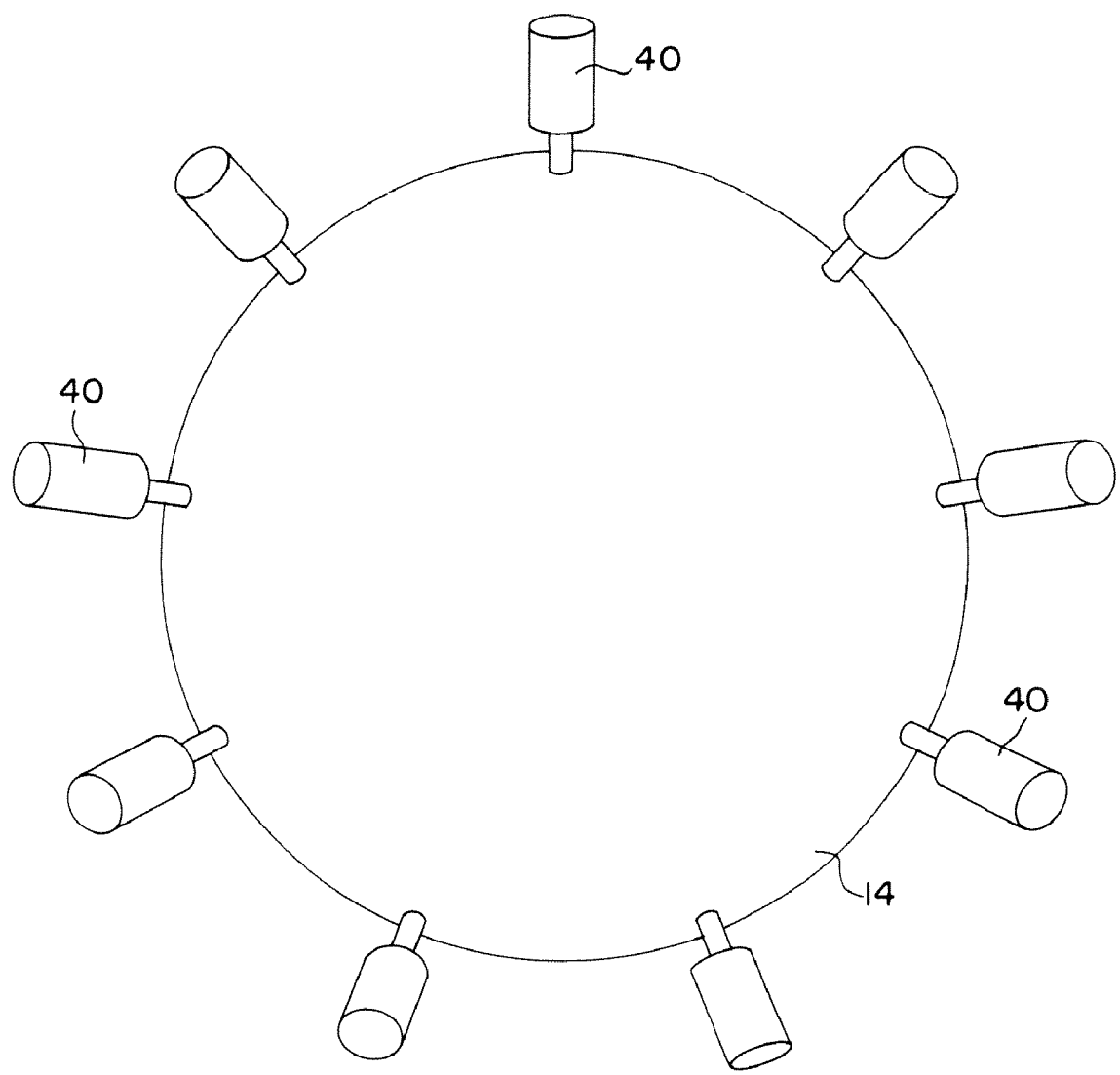
FIG. 2 is a diagrammatical plan view in accordance with the present invention showing a plurality of lamps positioned above a semiconductor wafer and having an angle of incidence with the wafer of greater than 0°.

As shown in FIG. 1, lamps 40 configured in accordance with the present invention can be used in conjunction with lamps 28. Alternatively, as shown in FIG. 2, wafer 14 can be heated solely by lamps 40. In particular, as shown in FIG. 2, lamps 40 are positioned surrounding the wafer 14 at desired angles.

In a still further embodiment of the present invention, lamps 40 can be used in conjunction with a susceptor that is placed adjacent to the wafer. The susceptor can include an electrical resistance heater for heating the wafer.

Referring to FIG. 1, in order to monitor the temperature of wafer 14 during the heating process, in this embodiment, thermal processing chamber 12 includes plurality of radiation sensing devices generally 27. Radiation sensing devices 27 include a plurality of optical fibers or light pipes 28 which are, in turn, in communication with a plurality of corresponding light detectors 30. Optical fibers 28 are configured to receive thermal energy being emitted by wafer 14 at a particular wavelength. The amount of sensed radiation is then communicated to light detectors 30 which generate a usable voltage signal for determining the temperature of the wafer which can be calculated based, in part, on Planck's Law. In one embodiment, each optical fiber 28 in combination with a light detector 30 comprises a pyrometer. In another embodiment, the optical fibers 28 are routed to a single but multiplexing radiation sensing device.

In general, thermal processing chamber 12 can contain one or a plurality of radiation sensing devices. In a preferred embodiment, as shown in FIG. 1, thermal processing chamber 12 contains a plurality of radiation sensing devices that measure the temperature of the wafer at different locations. Knowing the temperature of the wafer at different locations can then be used to control the amount of heat being applied to the wafer as will be described in more detail hereinafter. The amount of heat applied to various zones of the wafer can also be controlled in an open loop fashion. In this configuration the ratios between the various heating zones can be pre-determined after manual optimization.

System 10 further includes a window 32 which separates lamps 24 from the chamber. Window 32 serves to isolate lamps 24 from wafer 14 and prevent contamination of the chamber. Window 32 as shown in FIG. 1 can be a window positioned between chamber 12 and heat source 22.

Besides using radiation sensing devices, other temperature sensing devices may be used in the system of the present invention. For instance, one or more thermocouples may be incorporated into the system for monitoring the temperature of the wafer at a single location or at a plurality of locations. The thermocouples can be placed in direct contact with the wafer or can be placed adjacent the wafer from which the temperature can be extrapolated.

System 10 further includes a system controller 50 which can be, for instance, a microprocessor. Controller 50 receives voltage signals from light detectors 30 that represent the radiation amounts being sampled at the various locations. Based on the signals received, controller 50 is configured to calculate the temperature of wafer 14 at different locations.

System controller 50 as shown in FIG. 1 can also be in communication with lamp power controller 25. In this arrangement, controller 50 can determine the temperature of wafer 14, and, based on this information, control the amount of thermal energy being emitted by lamps 24 and/or lamps 40. In this manner, instantaneous adjustments can be made regarding the conditions within reactor 12 for processing wafer 14 within carefully controlled limits.

In one embodiment, controller 50 can also be used to automatically control other elements within the system. For instance, controller 50 can be used to control the flow rate of gases entering chamber 12 through gas inlet 18. As shown, controller 50 can further be used to control the rate at which wafer 14 is rotated within the chamber.

As described above, the present invention is generally directed to configuring various light sources in thermal processing chambers in order to optimize absorption of light energy by the wafer being heated. It is the intent of the present invention to minimize problems experienced in the past when processing wafers having different properties and/or being coated with different materials. In general, the present invention is directed to changing the angle of incidence of the light sources to maximize absorption, configuring the light emitted by the light sources to be placed in the p-polarized state or substantially in the p-polarized state in order to optimize absorption and/or to use several different wavelengths in order to ensure that at least some of the light energy is being efficiently absorbed by the wafer.

Figure 4:
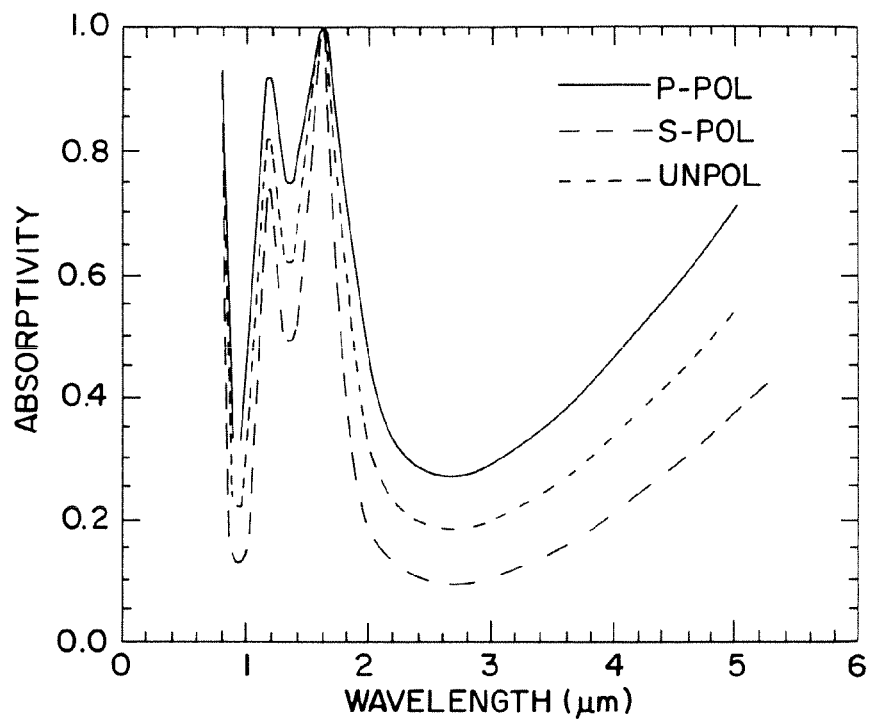
FIG. 4 is a graph showing the spectral absorptivity of a semiconductor wafer having a bottom coating of silicon dioxide and a top coating of polysilicon. The curves are shown for a 45° angle of incidence for p-polarized radiation, s-polarized radiation and unpolarized radiation.
Figure 5:
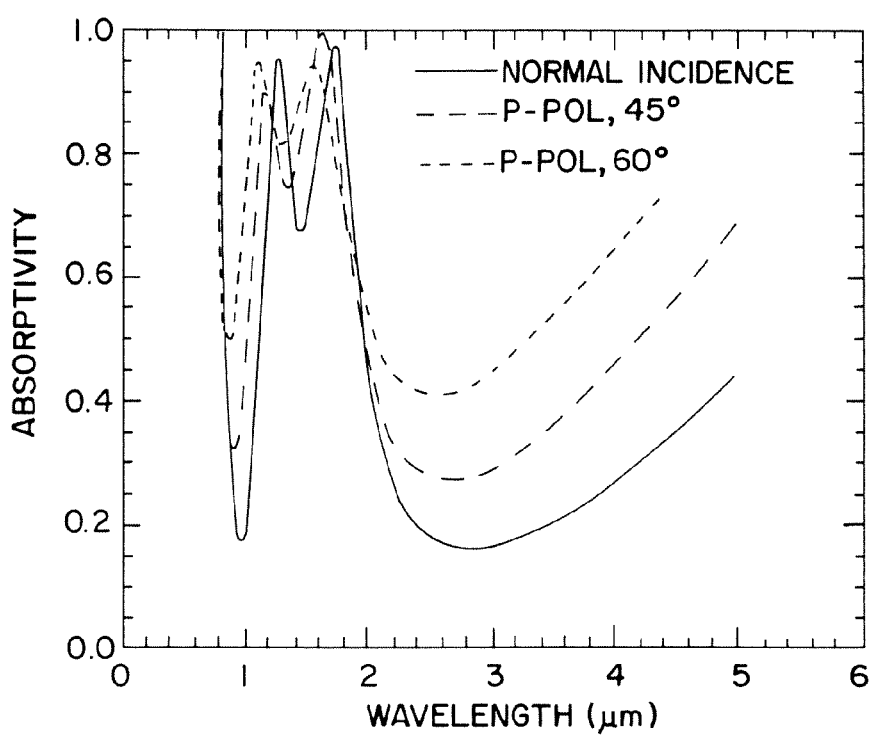
FIG. 5 is a graph showing the spectral absorptivity for the same structure as in FIG. 4. In this figure, however, the curves are for p-polarized radiation at different angles of incidence.

FIGS. 4 and 5 are intended to illustrate some of the concepts involved with respect to the present invention. FIG. 4 illustrates the spectral absorptivity of a semiconductor wafer that is coated with a two-layered coating. The two-layered coating includes a bottom coating of silicon dioxide and a top coating of polysilicon. Specifically, the bottom coating of silicon dioxide was 0.5 microns thick, while the top coating of polysilicon was 0.2 microns thick. The graph illustrated in FIG. 4 shows how absorption changes with wavelength. Further, the graph includes three curves representing the absorptivity for light energy contacting the wafer at an angle of incidence of 45° for the three cases of the light energy being in the (1) p-polarized state, (2) s-polarized state, and (3) unpolarized state. As shown, the unpolarized state becomes the average of the s-polarized and p-polarized states.

As shown in FIG. 4, the amount of variation in spectral absorptivity is reduced by contacting the wafer with light energy in the p-polarized state. Further, at any given wavelength the absorptivity is greater for the p-polarized light, which indicates better and more efficient power coupling.

FIG. 5 illustrates the spectral absorptivity of the same structure used to produce the results illustrated in FIG. 4. In the graph illustrated in FIG. 5, however, all of the curves represent light energy in the p-polarized state. In this graph, the angle of incidence varies between normal (0°), 45° and 60°.

As shown, the variations in spectral absorptivity are reduced as the angle of incidence rises from 0° to 60°. Further, increased absorptivity can be seen at different wavelengths depending upon the angle of incidence.

In accordance with the present invention, FIGS. 4 and 5 show that various benefits can be realized if (1) multiple wavelengths of light are used, (2) the light is configured in the p-polarized state and (3) the angle of incidence is increased to greater than 0°. Further, FIG. 5 also illustrates the potential benefit of arranging the lamps at more than one angle of incidence for further optimizing absorption.

Figure 6:
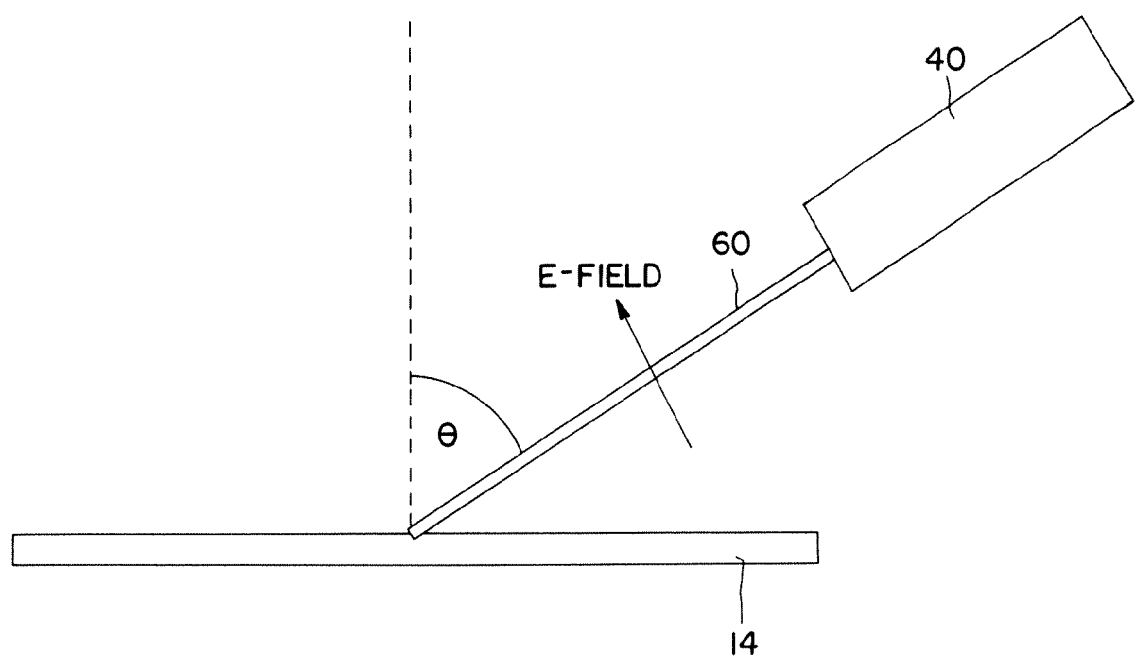
FIG. 6 is a side view illustrating a laser emitting a laser beam onto a semiconductor wafer at an angle of incidence greater than 0°.
Figure 7A:
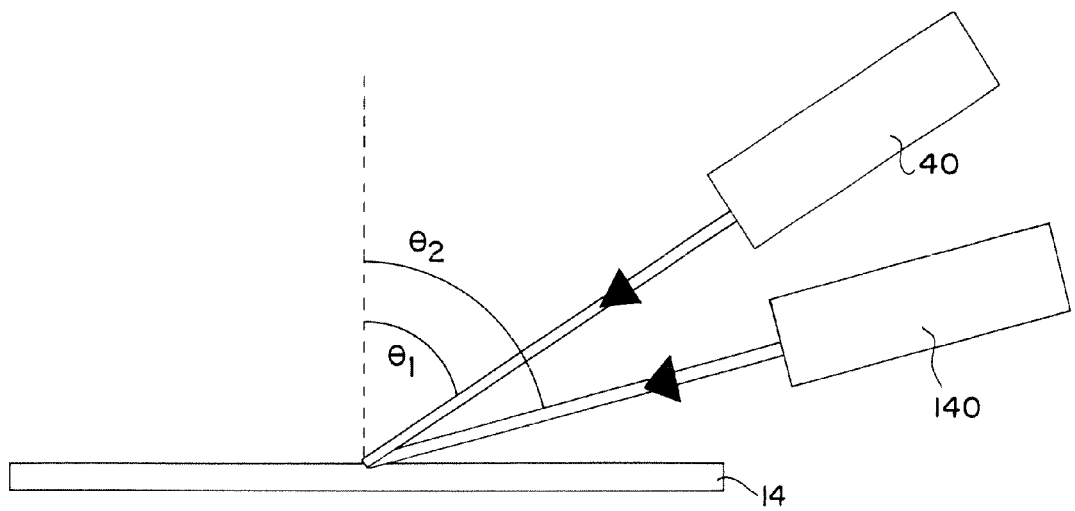
FIG. 7(a) is a side view of two different lasers emitting laser beams onto a semiconductor wafer at different angles of incidence.
Figure 7B:
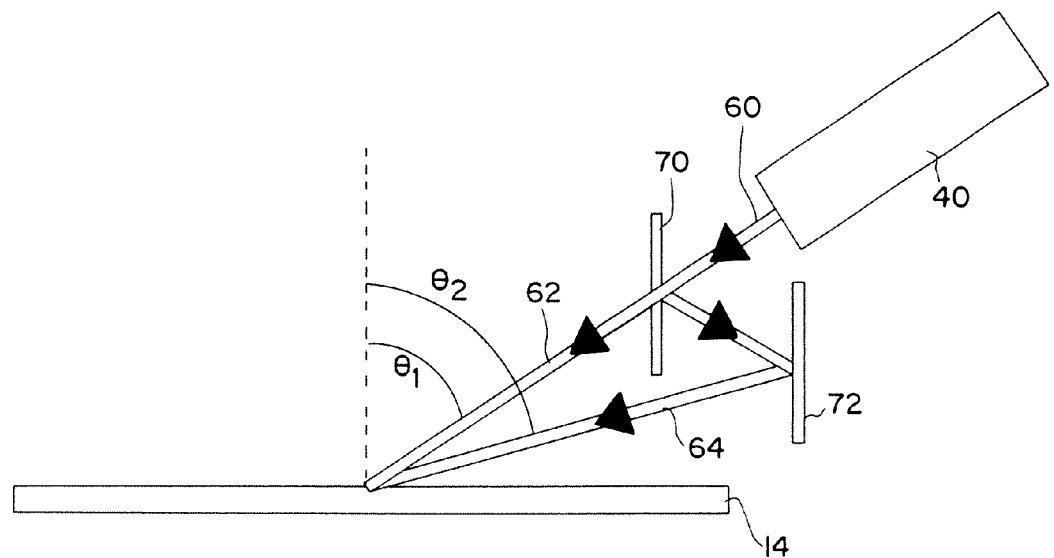
FIG. 7(b) is a side view of a laser beam being split into two different beams that contact a semiconductor wafer at two different angles of incidence.
Figure 8:
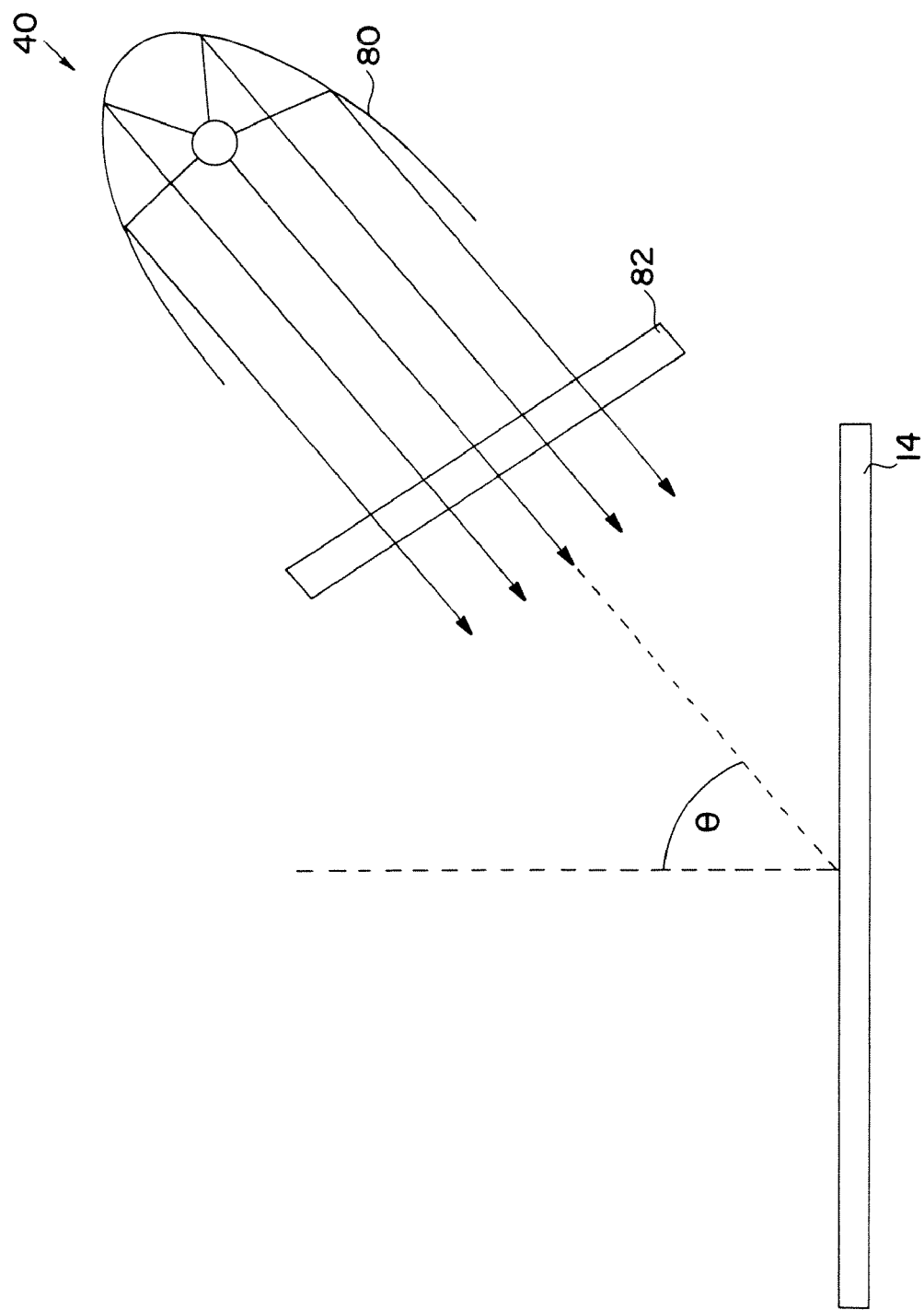
FIG. 8 is a side view of an incoherent light source in which light emitted from the light source is collimated and then polarized contacting a wafer at an angle of incidence greater than 0°.
Figure 9:
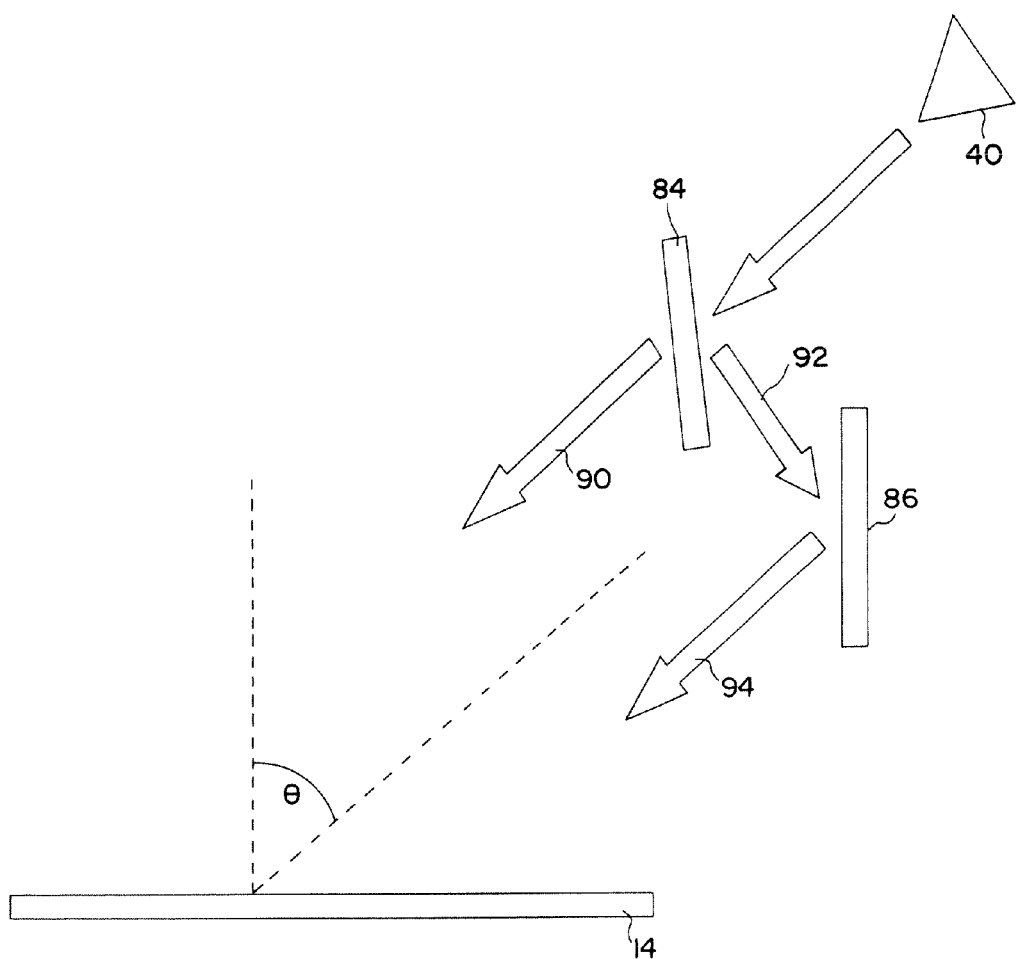
FIG. 9 is an alternative embodiment of the process shown in FIG. 8, in which the polarizing device splits the light into two different p-polarized radiation beams.

Referring to FIGS. 6 through 9, various applications of the present invention will now be discussed in detail. FIGS. 6 and 7 are particularly directed to the use of lasers for heating semiconductor wafers, while FIGS. 8 and 9 are directed to applying the concepts of the present invention to incoherent light sources.

Referring to FIG. 6, a laser 40 is shown emitting a laser beam 60 onto a wafer 14 at an angle of incidence 2. In general, lasers emit light over a relatively narrow wavelength range. Lasers can be very effective heating devices providing light at a very high intensity. Because of the highly monochromatic nature of laser radiation, however, there is effectively very little spectral averaging of power absorption by the wafer, which makes laser heating especially susceptible to power absorption fluctuations during a single heating cycle for a semiconductor wafer and during the processing of different wafers.

As shown in FIG. 6, absorption fluctuations can be minimized by changing the angle of incidence of the laser beam 60. As described above, the reflectivity of most surfaces is a function of the angle of incidence. Thus, changing the angle of incidence of the laser light contacting the wafer can increase absorption.

For most applications, when processing semiconductor wafers, optimization of absorption occurs when the angle of incidence is greater than 10°, such as from about 40° to about 85° and more particularly from about 60° to about 85°. In particular, the reflectivity of silicon is very low near a critical angle, i.e. the Brewster angle. For silicon, the Brewster angle is approximately 75°.

Of particular advantage when using lasers is that not only is the radiation highly directional, but many types of laser light are naturally plane-polarized. Consequently, when adjusting the angle of incidence, the laser beam can also be placed in the p-polarized plane with respect to the wafer surface. As shown in FIGS. 4 and 5 above, optimization of light coupling to the wafer can occur when placing the light in the p-polarized state.

If should be understood, however, that besides placing the light in the p-polarized state, in other embodiments, it may be preferred to place the light in other configurations. For example, in an alternative embodiment, the light can be placed not in the p-polarized state, but near the p-polarized state. In an alternative embodiment, elliptically polarized light can be directed towards the wafer. Elliptically polarized light refers to polarization of an electromagnetic wave in which the electric field vector at any point in space describes an ellipse in a plane perpendicular to the propagation direction.

The particular light configuration used in any application will depend on various factors. For instance, the topography of the surface being heated can play a role in determining how the light contacting the wafer should be configured. Trenches, angles, and other non-smooth features of a surface, for example, can have an impact upon the absorption characteristics of the wafer. When dealing with a substrate having a 3-dimensional surface, in one embodiment, a planar surface can be defined that best takes into account the surface irregularities. Once the planar surface is defined, the polarization, the angle of incidence, and the wavelength of light to contact the surface can be selected.

Various methods can be used in order to orient the laser device for ensuring that the laser beam 60 strikes the wafer 14 in the p-polarized plane or in some other desirable configuration. For example, in order to adjust the laser beam into the p-polarized state, the laser can be rotated or the laser beam can be manipulated using mirrors and/or optics. In one embodiment, for instance, a half wave plate can be used to place the laser beam into a defined plane, such as a p-polarization plane.

Alternatively or in addition to adjusting the angle of incidence and placing the laser beam in a p-polarized state, several different types of lasers can be used in the thermal processing chamber that each emit light at different wavelengths. For instance, as shown in FIG. 7(a) a first laser 40 and a second laser 140 can emit light at different wavelengths onto the wafer 14.

Thus, when a particular substrate is highly reflective at the wavelength at which one laser operates, the second laser operating at a different wavelength can be used to heat the wafer. The radiation from the different lasers may be optically combined before contacting the wafer. Alternatively, several beams of light from the different lasers could illuminate a selected area of the wafer. In still another alternative embodiment, several beams of light could irradiate the same wafer radius as the wafer is rotated. The lasers can be arranged to illuminate the front and/or back of the wafer. Also, in one embodiment, the front of the wafer can be heated at a particular wavelength or range of wavelengths, while the back of the wafer can be heated by light at a different wavelength or range of wavelengths.

In one embodiment of the present invention, adjustable lasers can be used in order to heat the wafer. For example, lasers can be used that have an adjustable wavelength setting for adjusting the wavelength during a particular heating cycle or from heating cycle to heating cycle. Besides adjusting the wavelength, lasers used in the present invention can also be moveable for adjusting the angle of incidence during processing. In this manner, optimum power coupling between the light sources and the wafer can occur as the characteristics and properties of the surface of the wafer being heated changes.

Besides using lasers which operate at different wavelengths, as shown in FIG. 7(a), the angle of incidence of each laser 40 and 140 can be different so as to ensure that at least one of the lasers will have a high degree of absorption during the heating process.

Multiple angles of incidence can be created using multiple lasers as shown in FIG. 7 (a) or can be implemented using a single laser as shown in FIG. 7(b). As shown in FIG. 7(b), laser 40 emits a laser beam 60 which is broken into two beams 62 and 64 by a beam splitting device 70. In this embodiment, a mirror 72 is then used to direct laser beam 64 onto the wafer 14 at an angle of incidence that is different than the angle of incidence of laser beam 62. Besides a mirror 72, however, it should be understood that the laser beam can be directed onto the wafer using, for instance, fiber optics, lenses, light pipes, and the like.

In general, any suitable type of laser can be used in the present invention including both continuous wave lasers and pulsed lasers. In one embodiment, a laser diode is used. Laser diodes efficiently convert electricity into laser radiation and are available in high power ratings. For example, high power devices, delivering continuous power of greater than 10 watts are currently commercially available, with emission wavelengths between 400 nm and 4000 nm. The above described lasers can be combined with beam delivery optics that reshape the emitted beam and direct it to the wafer. For example, the laser can be coupled with fiber optics for guiding the light onto a particular location of the wafer.

In one particular embodiment of the present invention, it has been discovered that the use of pulsed lasers may provide various advantages. Pulsed lasers produce high quantities of energy intermittently. Such lasers may be particularly well suited for use in anneal processes, particularly ion implantation damage anneal processes. It is believed that pulsed lasers can provide controlled damage annealing for producing films having superior qualities.

As described above, lasers emit highly directional light. In order to heat the entire surface of a semiconductor wafer using lasers, various techniques can be used. For instance, in one embodiment, a plurality of lasers can be positioned within the thermal processing chamber to contact different areas of the wafer. If desired, the laser beams being emitted by the lasers can also be shaped using optics, as long as shaping the beam does not interfere with the optimization techniques described herein. Alternatively, the laser beam can be scanned over the entire surface of the wafer or over a selected region.

Besides configuring laser beams, the present invention is also applicable to light beams emitted by incoherent light sources, such as tungsten halogen lamps or arc lamps. The light sources can emit continuous light or pulsed light. Incoherent light sources typically emit light energy over a broader spectrum than lasers. As a result, less variations in power coupling occur when using incoherent light sources due to a larger range of wavelengths and normally a wider range of angles of incidence. Nevertheless, the present invention can be used to further improve power coupling between incoherent light sources and a wafer being heated.

For example, in one embodiment, light being emitted by an incoherent light source can be collimated, polarized and configured to strike the wafer at an angle of incidence greater than 0°, particularly greater than 10° in accordance with the present invention.

For instance, referring to FIG. 8, an incoherent light source 40 is shown emitting light energy onto the wafer 14. The incoherent light source 40 can be, for instance, an arc lamp, a tungsten halogen lamp, and the like. As shown in the figure, light emitted from lamp 40 is collimated using a reflector 80 so that most of the light strikes the wafer 14 at a particular angle of incidence.

Reflector 80 surrounds the light source 40 and can have various shapes. In general, however, a parabolic shape as shown will create a collimated output beam.

Besides using a reflector, various other devices can be used to collimate the light being emitted by the lamp 40. For instance, an alternative embodiment, optical lenses can be used to better direct the light onto the wafer. For instance a converging lens, a cylindrical lens or a zone plate can be used alone or in combination with reflectors in order to collimate the light.

Besides collimating the light being emitted by the lamp 40, as shown in FIG. 8, the system of the present invention can further include a polarizing device 82. Polarizing device 82 is selected so that light exiting the polarizing device is in the p-polarized state. As a result of this configuration, light energy being emitted by the lamp 40 strikes the wafer 14 at a desired angle of incidence and in the p-polarized state for optimizing absorption by the wafer.

Besides placing the light in the p-polarized state, polarizing device 82 can also be used to place the light in a near p-polarized state or can be used to create elliptically polarized light as desired.

Many polarizing devices 82 as shown in FIG. 8, however, can significantly decrease the amount of light energy that reaches the wafer. For instance, some polarizing devices eliminate up to about 50% of the energy being emitted by the lamp 40. In order to more efficiently polarize the light being emitted from the lamp 40, in an alternative embodiment, a polarizing beam splitting device 84 can be used as shown in FIG. 9. Polarizing beam splitting device 84 receives the collimated light being emitted by lamp 40 and splits the light into two beams 90 and 92. Polarizing beam splitting device 84 is configured such that beam 90 is in the p-polarized state. As shown, beam 90 contacts the wafer 14 at a first angle of incidence.

Beam 92, on the other hand, is then further redirected using a mirror, optics, a half wave plate, or other suitable optic device 86. Specifically, light beam 92 is rotated, oriented or otherwise manipulated and redirected onto the wafer 14 as light beam 94 in the p-polarized state or in some other desired configuration at a second angle of incidence. The angle of incidence of beam 90 and 94 can be the same or can be different.

Various different polarizing devices may be used in the present invention. Polarizing beam splitting device 84, for instance, can be a wire grid polarizer, a thin film coated device such as a dielectric film coated device, a cube beam splitter, or any other suitable device.

Referring back to FIG. 1, as described above, the system of the present invention can include a controller 50. Controller 50 can be used to monitor the temperature of the wafer and control the amount of light energy being emitted onto the wafer accordingly. In one embodiment of the present invention, the controller 50 can be placed in communication with one or more sensors 98. Sensors 98 can be used to detect the amount of radiation that is being reflected from the wafer. Specifically, the sensors can help estimate the amount of power reflected in order to adjust the input power being delivered to the wafer. Sensors 98 would be particularly applicable in a system using laser illumination, where a simple estimate of the coupling could be obtained from the reflected beam intensity. This estimate could be obtained before processing, using a lower power beam, or during processing from the actual beam.

Besides changing the amount of power delivered to the wafer, information collected from the sensors can also be used to change the wavelength of light contacting the wafer and/or to change the angle of incidence of the light contacting the wafer.

Sensors 98 can be any suitable device capable of detecting reflected light. For example, sensors 98 can be photo detectors or thermal detectors.

In still a further embodiment of the present invention, the system can include reflectors positioned in the thermal processing chamber. The reflectors can be used to reflect light energy being reflected from the wafer back onto the wafer. Again, such reflectors would be particularly well suited for use in systems using laser beams. An example of a reflector that may be used is a corner cube retro reflector, which would send light being reflected from the wafer back onto the wafer at the same angle of reflection. By reflecting the light back onto the wafer, further light energy will be absorbed by the wafer during heating.

In still another embodiment of the present invention, the techniques and advantages of the present invention can be used to heat not only the wafer 14, but a slip free ring 99 as shown in FIG. 1. A slip free ring refers to a device that completely encircles or at least substantially surrounds the edges of a wafer and provides further energy to heat the edges of the wafer during processing. Slip free rings are generally used to counteract heat losses that occur at the wafer's edge.

In accordance with the present invention, slip free ring 99, as shown in FIG. 1, can be heated by the light devices 40 in a manner that optimizes thermal coupling. For instance, the light devices 40 can emit light at a particular angle of incidence and in a particular polarized state for optimizing the amount of thermal energy that is absorbed by the slip free ring 99. The particular angle of incidence, light wavelength, and polarized state of the light that heats the slip free ring will depend upon the material from which the slip free ring is made. For instance, the slip free ring can be made from various materials including silicon, silicon carbide, graphite, silicon carbide coated graphite, quartz, besides various other materials.

In accordance with the present invention, the slip free ring 99 can also be coated with various materials in order to optimize light absorption. For instance, the slip free ring can be coated with anti-reflective coatings. For example, in one embodiment, a silicon ring can be coated with silicon dioxide or silicon nitride.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A process for heating semiconductor substrates comprising:
   placing a semiconductor substrate in a processing chamber, the semiconductor substrate being coated with at least one material to form a pattern on a surface of the semiconductor substrate;
   directing first and second laser beams onto said semiconductor substrate from at least a first laser and a second laser for heating and increasing the temperature of the wafer, wherein said first laser emits light at a first wavelength range and said second laser emits light at a second wavelength range, said first wavelength range being different than second wavelength range, and wherein at least one of the laser beams contacts the semiconductor substrate at an angle of incidence of greater than about 40° and in a p-polarized state and has a power of at least about 10 watts; and
   based upon the pattern on the semiconductor substrate, determining an optimal angle of incidence of at least one of the laser beams that optimizes an absorption of the laser beam by the semiconductor substrate and contacting the semiconductor substrate at the determined optimal angle of incidence with the laser beam.

2. A process as defined in claim 1, wherein both laser beams are in a p-polarized state.

3. A process as defined in claim 1, wherein the at least one laser beam contacts said semiconductor substrate at an angle of incidence of from about 60° to about 85°.

4. A process as defined in claim 1, wherein said first laser beam contacts said semiconductor substrate at a first angle of incidence and said second laser beam contacts said semiconductor substrate at a second angle of incidence, said first angle of incidence and said second angle of incidence being different.

5. A process as defined in claim 1, wherein said semiconductor substrate is heated by other energy sources in addition to said laser beams.

6. A process as defined in claim 1, wherein at least certain of said laser beams are pulsed laser beams.

7. A process as defined in claim 1, wherein besides said laser beams, said semiconductor substrate is heated by an electrical resistance heater.

8. A process as defined in claim 1, further comprising the step of redirecting any portion of said laser beams that are reflected off said semiconductor substrate back onto said semiconductor substrate.

9. A process as defined in claim 1, further comprising the step of sensing the amount of light energy from one of the lasers that is reflected off the semiconductor substrate and, based on this information, changing the configuration of at least one of the lasers in order to change the amount of light energy absorbed by the semiconductor substrate.

10. A process as defined in claim 9, wherein the configuration of at least one of the lasers is changed by changing an amount of power being emitted by the laser.

11. A process as defined in claim 1, further comprising the step of scanning at least one of the laser beams over the semiconductor substrate.

12. A process for heating semiconductor substrates comprising:
    placing a semiconductor substrate in a processing chamber, the semiconductor substrate being coated with at least one material to form a pattern on a surface of the semiconductor substrate;
    directing at least a first laser beam and a second laser beam onto said semiconductor substrate for heating and increasing the temperature of said substrate, said first laser beam contacting said semiconductor substrate at a first angle of incidence, said second laser beam contacting said semiconductor substrate at a second angle of incidence, said first angle of incidence being different than said second angle of incidence, each of said first and second laser beams contacting said semiconductor substrate in a p-polarized state and wherein at least one of the laser beams has a power of at least about 10 watts; and
    based upon the pattern on the semiconductor substrate, determining an optimal angle of incidence of at least one of the laser beams that optimizes an absorption of the laser beam by the semiconductor substrate and contacting the semiconductor substrate at the determined optimal angle of incidence with the laser beam.

13. A process as defined in claim 12, wherein said first laser beam and said second laser beam are emitted from the same laser.

14. A process as defined in claim 12, wherein said first laser beam is emitted from a first laser and said second laser beam is emitted from a second laser.

15. A process as defined in claim 12, wherein at least said first laser beam comprises a pulsed laser beam.

16. A process as defined in claim 12, wherein said first angle of incidence and said second angle of incidence are greater than 10°.

17. A process as defined in claim 12, wherein at least one of the angles of incidence is from about 40° to 85°.

18. A process as defined in claim 12, wherein said first laser beam has a first wavelength range and said second laser beam has a second wavelength range, and wherein said first wavelength range is different from said second wavelength range.

19. A process as defined in claim 12, wherein said semiconductor substrate is heated by other energy sources in addition to said first laser beam and said second laser beam.

20. A process as defined in claim 12, further comprising the step of sensing the amount of said laser beams that is reflected off of said semiconductor substrate, and based on this information, changing the configuration of at least one laser in order to change the amount of light energy absorbed by said semiconductor substrate.

21. A process as defined in claim 12, further comprising the step of sensing the amount of light energy from one of the lasers that is reflected off the semiconductor substrate and, based on this information, changing the configuration of at least one of the lasers in order to change the amount of light energy absorbed by the semiconductor substrate.

22. A process as defined in claim 12, wherein at least one of the laser beams is scanned over the surface of the substrate.

23. An apparatus for heating semiconductor substrates comprising:
    a thermal processing chamber adapted to contain a semiconductor wafer; and
    a heater that comprises a first laser device that emits a first laser beam onto a semiconductor substrate contained in the chamber and a second laser device that emits a second laser beam onto a semiconductor substrate contained in the chamber for heating the substrate, the first laser device having a power of at least about 10 watts and being configured to emit a laser beam in a p-polarized state that contacts the semiconductor substrate at an angle of incidence greater than about 40°, and wherein the second laser device is configured to emit the second laser beam onto a semiconductor wafer contained in the thermal processing chamber at an angle of incidence that is different than the angle of incidence at which the first laser beam contacts the semiconductor substrate and wherein the first laser beam emitted by the first laser device has a different wavelength than the second laser beam emitted by the second laser device.

24. An apparatus as defined in claim 23, further comprising at least one temperature sensing device for sensing the temperature of a semiconductor substrate contained in the chamber.

25. An apparatus as defined in claim 24, further comprising a controller in communication with the at least one temperature sensing device, the controller being configured to control the laser device in response to temperature information received from the at least one temperature sensing device.

26. An apparatus as defined in claim 23, further comprising a sensor for sensing the amount of at least one of the laser beams that is reflected off of a semiconductor substrate.

27. An apparatus as defined in claim 26, further comprising a controller in communication with the sensor, the controller, based upon the amount of the laser beam that is reflected off a surface of a semiconductor substrate, being configured to control at least one of the laser devices in order to change the amount of light energy being absorbed by a semiconductor substrate.

28. An apparatus as defined in claim 23, wherein at least one of the first laser device or the second laser device comprises a laser diode.

29. An apparatus as defined in claim 23, wherein at least one of the laser devices comprises a continuous wave laser.

30. An apparatus as defined in claim 23, wherein at least one of the laser devices emits a pulsed laser beam.

31. An apparatus as defined in claim 23, wherein the at least one laser device emits a laser beam that contacts the semiconductor substrate at an angle of incidence of from about 60° to about 85°.

32. An apparatus as defined in claim 23, wherein at least one of the laser beams is configured to move relative to the substrate such that the laser beam is scanned over a surface of the substrate.

33. An apparatus as defined in claim 23, wherein the first and second laser beams are configured to move relative to the substrate such that the laser beams are scanned over a surface of the substrate.

34. A process as defined in claim 1, wherein the semiconductor substrate is heated to a temperature of from about 400° C. to about 1200° C. during the process.

35. A process as defined in claim 12, wherein the semiconductor substrate is heated to a temperature of from about 400° C. to about 1200° C. during the process.

36. A process as defined in claim 1, wherein both laser beams have a power of at least about 10 watts.

37. A process as defined in claim 12, wherein both laser beams have a power of at least about 10 watts.

* * * * *